United States Patent [19]
Sato

[11] Patent Number: 6,084,524
[45] Date of Patent: Jul. 4, 2000

[54] PHOTOELECTRIC DETECTION SWITCH

[75] Inventor: Norihito Sato, Osaka, Japan

[73] Assignee: Keyence Corporation, Osaka, Japan

[21] Appl. No.: 09/345,784

[22] Filed: Jul. 1, 1999

[30] Foreign Application Priority Data

Jul. 2, 1998 [JP] Japan .................................. 10-187189

[51] Int. Cl.⁷ .................................................. G08B 21/00
[52] U.S. Cl. .......................... 340/674; 340/673; 340/644; 250/222.2
[58] Field of Search .................................... 340/644, 674, 340/673, 675, 676; 250/221–224

[56] References Cited

U.S. PATENT DOCUMENTS

| | | | |
|---|---|---|---|
| 3,838,341 | 9/1974 | Gaines | 324/161 |
| 4,349,883 | 9/1982 | Doljack | 198/810.02 |
| 4,735,323 | 4/1988 | Okada et al. | 209/582 |
| 4,785,295 | 11/1988 | Fukui et al. | 340/679 |
| 4,807,162 | 2/1989 | Shibayama et al. | 702/144 |
| 4,893,006 | 1/1990 | Wakai et al. | 356/73.1 |

*Primary Examiner*—Daniel J. Wu
*Assistant Examiner*—Sihong Huang
*Attorney, Agent, or Firm*—Morgan, Lewis & Bockius LLP

[57] ABSTRACT

A detection switch for enabling the setup sensitivity of the switch to be checked without lowering the movement speed of an object to be detected. A light reception section outputs a light reception signal RS corresponding to a light reception amount. A detection section amplifies the light reception signal RS and converts the amplified light reception signal RS from analog to digital form, then outputs the digital signal as light reception data RD indicating the light reception amount. A hold time control section 5 gives a hold timing signal HT defining a hold period to a hold circuit. The hold circuit holds the peak value or bottom value of the light reception data RD every hold period and outputs the hold value to a control section each time the end of the hold period is reached. The control section causes a display section to display the hold value.

11 Claims, 10 Drawing Sheets

PHOTOELECTRIC DETECTION SWITCH

BACKGROUND OF THE INVENTION

1. Field of the Invention

This invention relates to a photoelectric detection switch for detecting the presence or absence of an object.

2. Description of the Related Art

Hitherto, detection switches such as a photoelectric switches, proximity switches, and ultrasonic switches have been used for detecting the presence or absence of an object moving on a production line in a factory, etc. The detection switch detects the presence or absence of an object by emitting light energy, a magnetic force, an ultrasonic wave, etc., to a sense area and detecting energy reflected from the sense area or energy penetrating the sense area.

For example, the photoelectric switch determines whether or not an object exists by emitting light to the object transport passage and detecting the presence or absence of light reflected from the object or light penetrating the object.

With the photoelectric switch of the penetration type, if the object to be detected does not exist in the sense area, light emitted from a light emission section enters a light reception section. In this case, if the light reception amount level in the light reception section is equal to or less than a predetermined threshold value, the object to be detected is determined to exist. On the other hand, with the photoelectric switch of the reflection type, if the object to be detected exists in the sense area, light emitted from a light emission section is reflected by the object and the reflected light enters a light reception section. In this case, if the light reception amount level in the light reception section exceeds a predetermined threshold value, the object to be detected is determined to exist. The sensitivity of the photoelectric switch is adjusted by changing the threshold value.

With such photoelectric switches, the light reception amount level may lower due to a shift in the optical axis, dirt on the light emission or reception face, characteristic degradation of the light emitting element of the light emission section, etc. Then, if a photoelectric switch has a display section for visually displaying the light reception amount, such lowering of the light reception amount level can be recognized visually. The threshold value of the photoelectric switch can then be changed at the proper time for resetting the sensitivity of the photoelectric switch.

With the photoelectric switch, when the change amount of the light reception amount per unit of time is small, for example, in such a case where the object to be detected does not move as at the installation stage of the photoelectric switch or moves at a very low speed, the light reception amount displayed on the display section can be read, whereby the operator can check whether or not the sensitivity of the photoelectric switch is adequate.

However, when the change amount of the light reception amount per unit of time is large, for example, in such a case where the object to be detected moves at a high speed, the light reception amount displayed on the display section is changed at a high speed, thus it becomes difficult to read the light reception amount. As a result, the operator cannot check whether or not the sensitivity of the photoelectric switch is adequate based on the light reception amount displayed on the display section.

Therefore, to check whether or not the sensitivity of the switch is adequate, measures, such as stopping the production line, need to be taken for lowering the movement speed of the object to be detected. The efficiency of resetting the sensitivity of the switch is very poor.

To detect the object to be detected on the production line, the light reception amount in the photoelectric switch varies due to variations in the position and surface state of each object to be detected. In such a case, the sensitivity of the switch needs to be set so that the detection result is not affected by the variations in the objects to be detected.

It is therefore an object of the invention to provide a detection switch for enabling the setup sensitivity of the switch to be easily checked without lowering the movement speed of an object to be detected.

It is therefore another object of the invention to provide a detection switch for enabling the setup sensitivity of the switch to be easily checked without lowering the movement speed of an object to be detected, and also enabling the sensitivity of the switch to be set so that the detection result is not affected by variations in the objects to be detected.

It is therefore still another object of the invention to provide a photoelectric switch for enabling the setup sensitivity of the switch to be easily checked without lowering the movement speed of an object to be detected.

It is therefore still another object of the invention to provide a photosensitive switch for enabling the setup sensitivity of the switch to be easily checked without lowering the movement speed of an object to be detected and also enabling the sensitivity of the switch to be set so that the detection result is not affected by variations in the objects to be detected.

SUMMARY OF THE INVENTION (1) First aspect of the invention

According to a first aspect of the invention, there is provided a detection switch for detecting the presence or absence of a moving object to be detected at one position, the detection switch comprising detection means for outputting the detection amount provided depending on the presence or absence of the object to be detected, threshold value setting means for setting a threshold value, comparison means for comparing the detection amount output from the detection means with the threshold value set through the threshold value setting means and outputting the comparison result, detection signal output means for outputting the presence or absence of the object to be detected as a detection signal based on the comparison result output from the comparison means, hold means for holding the maximum or minimum value of the detection amounts output from the detection means every predetermined hold period and outputting the maximum or minimum value for each hold period, and display means for displaying the maximum or minimum value output from the hold means.

In the detection switch according to the invention, the threshold value is preset by the threshold value setting means. The detection amount provided depending on the presence or absence of the object to be detected is output by the detection means. The detection amount output from the detection means is compared with the threshold value set through the threshold value setting means by the comparison means. The presence or absence of the object to be detected is output by the detection signal output means as a detection signal based on the comparison result. The maximum or minimum value of the detection amounts output from the detection means every predetermined hold period is held and the maximum or minimum value is output for each hold period by the hold means. The maximum or minimum value output from the hold means is displayed by the display means.

The maximum or minimum value of the detection amounts held every hold period is displayed by the display means. Thus, if the objects to be detected move at a high speed, the setup sensitivity of the switch can be easily checked without lowering the movement speed of the objects to be detected.

(2) Second aspect of the invention

As the detection switch according to a second aspect of the invention, the detection switch according to the first aspect of the invention further includes hold period setting means for setting the hold period to a constant time. In this case, the maximum or minimum value of the detection amounts output from the detection means every constant hold period is held by the hold means.

(3) Third aspect of the invention

As the detection switch according to a third aspect of the invention, the detection switch according to the first aspect of the invention further includes hold period setting means for setting the hold period based on the number of times a predetermined result has occurred in the detection signal output from the detection signal output means.

In this case, if the movement speed of the objects to be detected is not constant or if the objects to be detected are not equally spaced from each other, the maximum or minimum value of the detection amounts can be calculated from a given number of samples.

(4) Fourth aspect of the invention

In the detection switch according to a fourth aspect of the invention, in the configuration of the detection switch according to the second or third aspect of the invention, the hold period setting means sets the hold period to any desired time in response to external operation. In this case, the user can set the hold period to any desired time.

(5) Fifth aspect of the invention

In the detection switch according to a fifth aspect of the invention, in the configuration of the detection switch according to any of the first to fourth aspects of the invention, the display means displays the threshold value set through the threshold value setting means or the ratio or the difference between the threshold value and the maximum or minimum value output from the hold means.

In this case, the threshold value or the ratio or the difference between the threshold value and the maximum or minimum value is displayed on the display means, so that whether or not the sensitivity of the switch is optimum can be easily known.

(6) Sixth aspect of the invention

According to a sixth aspect of the invention, there is provided a detection switch for detecting the presence or absence of a moving object to be detected at one position, the detection switch comprising detection means for outputting the detection amount provided depending on the presence or absence of the object to be detected, threshold value setting means for setting a threshold value, comparison means for comparing the detection amount output from the detection means with the threshold value set through the threshold value setting means and outputting the comparison result, detection signal output means for outputting the presence or absence of the object to be detected as a detection signal based on the comparison result output from the comparison means, hold and output means for assuming that the time interval between a predetermined result in the detection signal output from the detection signal output means and the next predetermined result is one hold period and holding and outputting a maximum or minimum value of the detection amounts output from the detection means for each hold period, hold value output means for outputting a minimum value of the maximum values output from the hold and output means within a predetermined number of the hold periods or a maximum value of the minimum values output from the hold and output means within a predetermined number of the hold periods, and display means for displaying the minimum or maximum value output from the hold value output means.

In the detection switch according to the invention, the threshold value is preset by the threshold value setting means. The detection amount provided depending on the presence or absence of the object to be detected is output by the detection means. The detection amount output from the detection means is compared with the threshold value set through the threshold value setting means by the comparison means. The presence or absence of the object to be detected is output by the detection signal output means as a detection signal based on the comparison result.

The time interval between a predetermined result in the detection signal output from the detection signal output means and the next predetermined result is assumed to be one hold period and the maximum or minimum value of the detection amounts output from the detection means for each hold period is held and output by the hold and output means. The minimum value of the maximum values output from the hold and output means within a predetermined number of the hold periods or the maximum value of the minimum values output from the hold and output means within a predetermined number of the hold periods is output from the hold value output means, and the minimum or maximum value output from the hold value output means is displayed by the display means.

The minimum value of the maximum values of the detection amounts output within the predetermined number of the hold periods or the maximum value of the minimum values of the detection amounts within the predetermined number of the hold periods is displayed by the display means. Thus, if the objects to be detected move at a high speed, whether or not the sensitivity of the switch is adequate can be easily checked without lowering the speed of the objects to be detected, and the worst value of the margin of the sensitivity of the switch can be known.

Therefore, the threshold value is set so as to have a margin with respect to the worst value, whereby the optimum sensitivity of the switch can be set with the detection result not affected by variations in the objects to be detected.

(7) Seventh aspect of the invention

As the detection switch according to a seventh aspect of the invention, the detection switch according to the sixth aspect of the invention further includes hold period setting means for setting the predetermined number of the hold periods to a constant value. In this case, the minimum value of the maximum values or the maximum value of the minimum values held and output by the hold and output means within the constant number of the hold periods is output by the hold value output means.

(8) Eighth aspect of the invention

In the detection switch according to an eighth aspect of the invention, in the configuration of the detection switch according to the seventh aspect of the invention, the hold period setting means sets the predetermined number of the hold periods to any desired value in response to external operation. In this case, the user can set the predetermined number of the hold periods to any desired value.

(9) Ninth aspect of the invention

In the detection switch according to a ninth aspect of the invention, in the configuration of the detection switch according to any of the sixth to eighth aspects of the invention, the display means displays the threshold value set through the threshold value setting means or the ratio or the difference between the threshold value and the minimum or maximum value output from the hold value output means.

In this case, the threshold value or the ratio or the difference between the threshold value and the minimum or maximum value is displayed on the display means, so that whether or not the sensitivity of the switch is optimum can be known easily.

(10) Tenth aspect of the invention

According to a tenth aspect of the invention, there is provided a photoelectric switch for detecting the presence or absence of a moving object to be detected at a detection position, the photoelectric switch comprising light emission means for emitting light to the detection position, light reception means for receiving penetrating light or reflected light from the detection position, detection means for outputting the light reception amount of the light reception means, threshold value setting means for setting a threshold value, comparison means for comparing the light reception amount output from the detection means with the threshold value set through the threshold value setting means and outputting the comparison result, detection signal output means for outputting the presence or absence of the object to be detected as a detection signal based on the comparison result output from the comparison means, hold means for holding a maximum or minimum value of the light reception amounts output from the detection means every predetermined hold period and outputting the maximum or minimum value for each hold period, and display means for displaying the maximum or minimum value output from the hold means.

In the photoelectric switch according to the invention, the threshold value is preset by the threshold value setting means. The detection amount provided depending on the presence or absence of the object to be detected is output by the detection means. The detection amount output from the detection means is compared with the threshold value set through the threshold value setting means by the comparison means. The presence or absence of the object to be detected is output by the detection signal output means as a detection signal based on the comparison result. The maximum or minimum value of the detection amounts output from the detection means every predetermined hold period is held and the maximum or minimum value is output for each hold period by the hold means. The maximum or minimum value output from the hold means is displayed by the display means.

The maximum or minimum value of the light reception amounts held every hold period is displayed by the display means. Thus, if the objects to be detected move at a high speed, the setup sensitivity of the switch can be easily checked without lowering the movement speed of the objects to be detected.

(11) Eleventh aspect of the invention

According to an eleventh aspect of the invention, there is provided a photoelectric switch for detecting the presence or absence of a moving object to be detected at a detection position, the photoelectric switch comprising light emission means for emitting light to the detection position, light reception means for receiving penetrating light or reflected light from the detection position, detection means for outputting the light reception amount of the light reception means, threshold value setting means for setting a threshold value, comparison means for comparing the light reception amount output from the detection means with the threshold value set through the threshold value setting means and outputting the comparison result, detection signal output means for outputting the presence or absence of the object to be detected as a detection signal based on the comparison result output from the comparison means, hold and output means for assuming that the time interval between a predetermined result in the detection signal output from the detection signal output means and the next predetermined result is one hold period and holding and outputting a maximum or minimum value of the light reception amounts output from the detection means for each hold period, hold value output means for outputting a minimum value of the maximum values output from the hold and output means within a predetermined number of the hold periods or a maximum value of the minimum values output from the hold and output means within a predetermined number of the hold periods, and display means for displaying the minimum or maximum value output from the hold value output means.

In the photoelectric switch according to the invention, the threshold value is preset by the threshold value setting means. The light reception amount provided depending on the presence or absence of the object to be detected is output by the detection means. The light reception amount output from the detection means is compared with the threshold value set through the threshold value setting means by the comparison means. The presence or absence of the object to be detected is output by the detection signal output means as a detection signal based on the comparison result.

The time interval between a predetermined result in the detection signal output from the detection signal output means and the next predetermined result is assumed to be one hold period and the maximum or minimum value of the light reception amounts output from the detection means for each hold period is held and output by the hold and output means. The minimum value of the maximum values output from the hold and output means within a predetermined number of the hold periods or the maximum value of the minimum values output from the hold and output means within a predetermined number of the hold periods is output from the hold value output means, and the minimum or maximum value output from the hold value output means is displayed by the display means.

The minimum value of the maximum values of the light reception amounts output within the predetermined number of the hold periods or the maximum value of the minimum values of the light reception amounts within the predetermined number of the hold periods is displayed by the display means. Thus, if the objects to be detected move at a high speed, whether or not the sensitivity of the switch is adequate can be easily checked without lowering the speed of the objects to be detected, and the worst value of the margin of the sensitivity of the switch can be known.

Therefore, the threshold value is set so as to have a margin with respect to the worst value, whereby the optimum sensitivity of the switch can be set with the detection result not affected by variations in the objects to be detected.

The entire disclosure of each and every foreign patent application from which the benefit of foreign priority has been claimed in the present application is incorporated herein by reference, as if fully set forth.

DETAILED DESCRIPTION OF THE INVENTION

Photoelectric switches will be discussed as an example of detection switches according to the invention.

Figure 1:
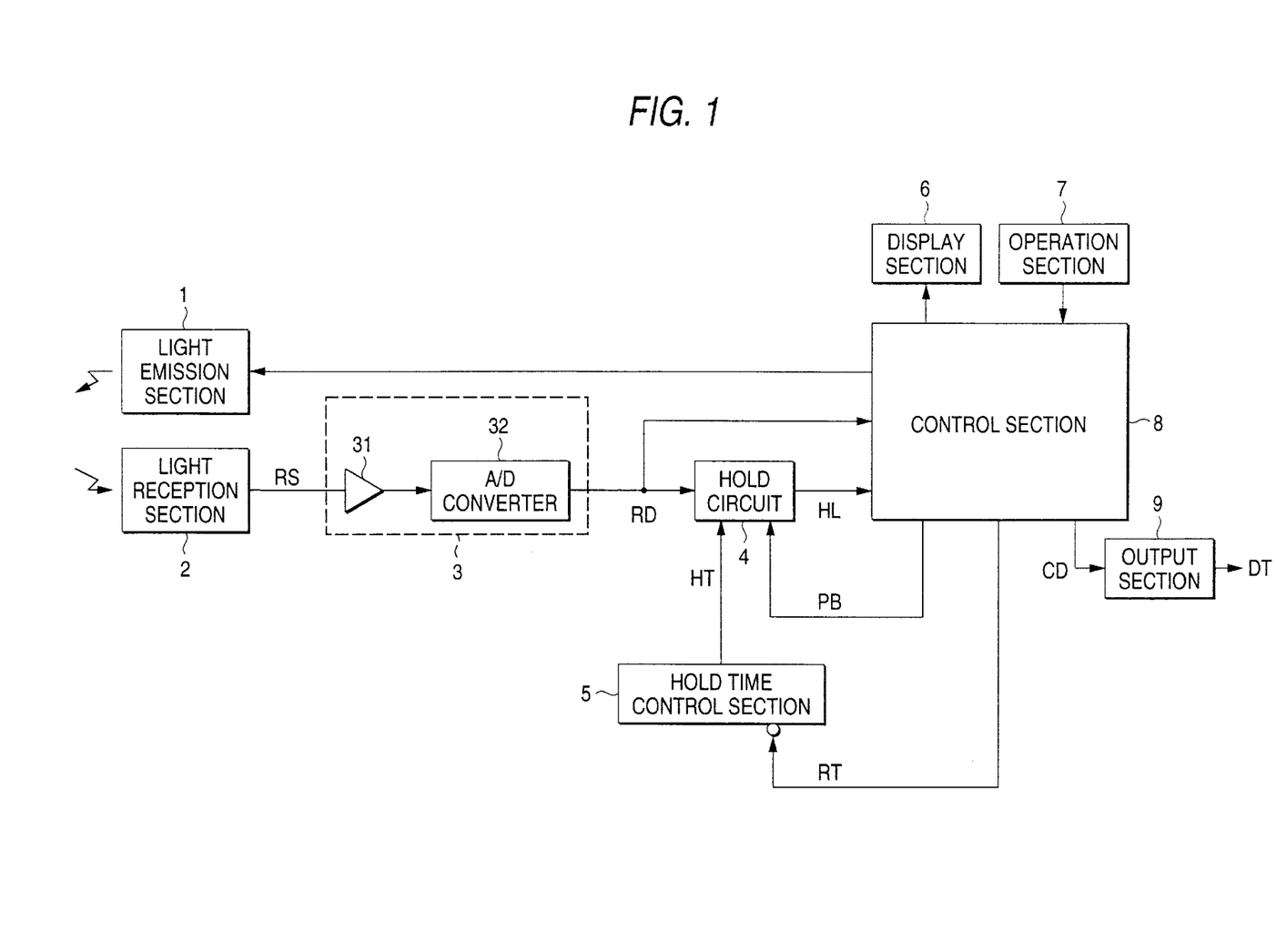
FIG. 1 is a block diagram showing the configuration of a photoelectric switch in a first embodiment of the invention.

FIG. 1 is a block diagram showing the configuration of a photoelectric switch in a first embodiment of the invention. In FIG. 1, the photoelectric switch comprises a light emission section 1, a light reception section 2, a detection section 3, a hold circuit 4, a hold time control section 5, a display section 6, an operation section 7, a control section 8, and an output section 9.

The control section 8 controls the sections of the photoelectric switch. The light emission section 1 contains a light emitting element such as an LED (light emitting diode) and emits light to a sense area under the control of the control section 8. If the photoelectric switch is of reflection type, when an object to be detected exists in the sense area, light reflected from the object to be detected is received at the light reception section 2. On the other hand, if the photoelectric switch is of penetration type, when an object to be detected does not exist in the sense area, light emitted from the light emission section 1 is received at the light reception section 2.

The light reception section 2 contains a light receiving element such as a photodiode and outputs an analog light reception signal RS corresponding to the light reception amount. The detection section 3 comprises an amplifier 31 and an A/D converter (analog/digital converter) 32. The amplifier 31 amplifies the light reception signal RS output from the light reception section 2. The A/D converter 32 converts the analog light reception signal RS amplified by the amplifier 31 into a digital signal and outputs the digital signal as light reception data RD indicating the light reception amount.

The light reception data RD output from the A/D converter 32 is fed into the control section 8 and the hold circuit 4. The control section 8 compares the light reception amount indicated on the light reception data RD with a preset threshold value, thereby determining the light entry state in the light reception section 2 and the light shield state, and outputs the determination result to the output section 9 as a comparison signal CD. The output section 9 outputs the comparison signal CD, for example, through a noise removing filter circuit as a detection signal DT.

The user can select a light entry on mode or a light shield on mode as a detection mode on the operation section 7. In the light entry on mode, when the light reception amount level exceeds the threshold value, the detection signal DT goes on (for example, high); when the light reception amount level is equal to or less than the threshold value, the detection signal DT goes off (for example, low). In the light shield on mode, when the light reception amount is equal to or less than the threshold value, the detection signal DT goes on; when the light reception amount exceeds the threshold value, the detection signal DT goes off.

The sensitivity of the switch can be set by adjusting the threshold value set in the control section 8 through the operation section 7.

The hold circuit 4 holds the peak value (maximum value) or the bottom value (minimum value) of the light reception data RD output from the A/D converter 32 every hold period defined by the hold time control section 5 described later.

The user can set a peak hold mode for holding the peak value or a bottom hold mode for holding the bottom value as a hold mode with a switch such as a slide switch or a pushbutton switch of the operation section 7.

If the user selects the light entry on mode, the hold mode may be automatically set to the peak hold mode and if the user selects the light shield on mode, the hold mode may be automatically set to the bottom hold mode.

The control section 8 gives a hold mode change signal PB to the hold circuit 4. If the hold mode change signal PB indicates the peak hold mode, the hold circuit 4 holds the peak value of the light reception data RD; if the hold mode change signal PB indicates the bottom hold mode, the hold circuit 4 holds the bottom value of the light reception data RD.

The hold circuit 4 performs processing of moving average, etc., for the light reception data RD output from the A/D converter 32 to remove external noise, then stores the resultant light reception data in an internal register. In the peak hold mode, the light reception data of a larger value than that stored in the internal register is rewritten into the internal register in sequence in the hold period, whereby the peak value of the light reception amounts in the hold period is stored in the internal register. In the bottom hold mode, the light reception data of a smaller value than that stored in the internal register is rewritten into the internal register in sequence in the hold period, whereby the bottom value of the light reception amounts in the hold period is stored in the internal register.

The peak value and the bottom value held by the hold circuit 4 will be hereinafter referred to as hold values.

The hold time control section 5 gives a pulse-like hold timing signal HT having a period corresponding to the hold period to the hold circuit 4. The hold circuit 4 outputs the hold value stored in the internal register to the control section 8 as hold data HL in synchronization with the rising edge of the hold timing signal HT and at the same time, initializes the hold value in the internal register. The hold circuit 4 thus outputs the hold value to the control section 8 each time the end of the hold period defined by the hold timing signal HT is reached.

The hold time control section 5 is reset according to a reset signal RT output from the control section 8. When the reset signal RT is active, the hold time control section 5 does not generate the pulse-like hold timing signal HT. When the reset signal RT becomes inactive, the hold time control section 5 gives the pulse-like hold timing signal HT to the hold circuit 4.

Therefore, the timing at which the hold time control section 5 gives the hold timing signal HT to the hold circuit 4 can be controlled by adjusting the timing at which the control section 8 makes the reset signal RT inactive.

The user can also set any desired hold time in the hold time control section 5 through the control section 8 by operating the operation section 7.

The control section 8 causes the display section 6 to display the light reception amount or the hold value changing in real time based on the light reception data RD output from the A/D converter 32 or the hold data HL output from the hold circuit 4.

The user can set a display mode to a light reception amount display mode for displaying the light reception amount on the display section 6 or a hold value display mode for displaying the hold value by operating the operation section 7. The control section changes the display mode to the light reception amount display mode or the hold value display mode accordingly.

The user can also set the display mode to a threshold value display mode or a margin display mode by operating the operation section 7. The threshold value display mode is for displaying a threshold value on the display section 6. The margin display mode is for displaying a margin of the light reception amount relative to the threshold value (described later).

The control section 8 is made of a CPU (central processing unit) an ASIC (application-specific integrated circuit), or the like. Not only the control section 8, but also other circuits of the hold circuit 5, the hold time control section 5, etc., can be provided by either or both of a CPU and an ASIC.

In this embodiment, the light emission section 1, the light reception section 2, and the detection section 3 make up detection means. The operation section 7 corresponds to a threshold value setting means. The control section 8 corresponds to a comparison means. The output section 9 corresponds to a detection signal output means. The light emission section 1 corresponds to a light emission means and the light reception section 2 corresponds to a light reception means. The hold circuit 4 corresponds to a hold means and the display section 6 corresponds to a display means. Further, the hold time control section 5 and the control section 8 make up the hold period setting means.

Figure 2:
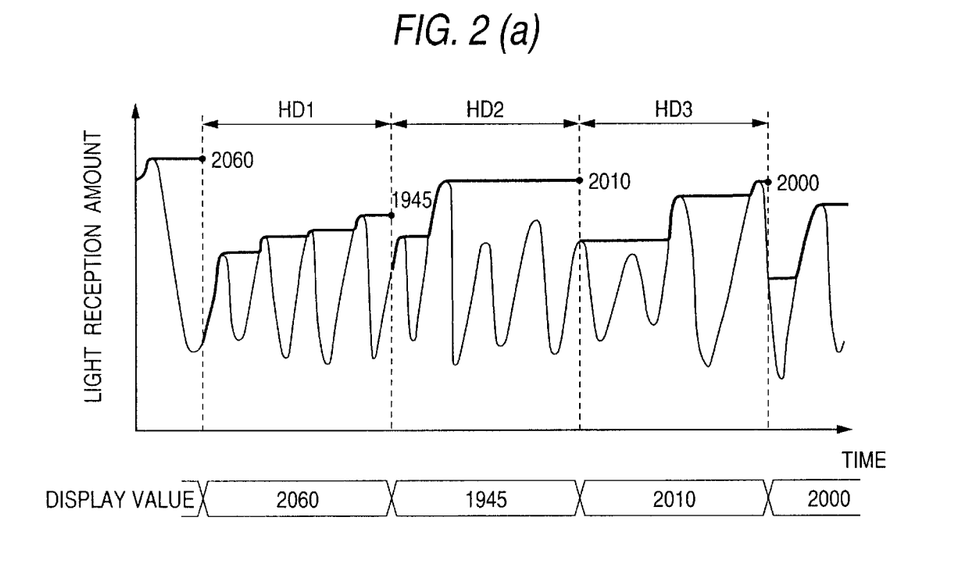
FIGS. 2(a) and 2(b) are drawings showing light reception amount change and display values in a peak hold mode and a bottom hold mode respectively.

Next, the display operation in the photoelectric switch in FIG. 1 will be discussed with reference to FIGS. 2(a) and 2(b). FIGS. 2(a) and 2(b) are drawings showing light reception amount change and display values in the photoelectric switch in FIG. 1 in the peak hold mode and the bottom hold mode respectively, wherein the hold value at each point in time is indicated by the solid line.

As shown in FIG. 2(a), in the peak hold mode, the peak value of the light reception amount is held in each hold period, and at the end of the hold period, is sent through the control section 8 to the display section 6, which then displays the peak value during the next hold period.

For example, the peak value 1945 in a hold period HD1 is sent through the control section 8 to the display section 6 at the end of the hold period HD1 and is displayed on the display section 6 during the next hold period HD2. The peak value 2010 in the hold period HD2 is sent through the control section 8 to the display section 6 at the end of the hold period HD2 and is displayed on the display section 6 during the next hold period HD3.

As shown in FIG. 2(b), in the bottom hold mode, the bottom value of the light reception amount is held in each hold period, and at the end of the hold period, is sent through the control section 8 to the display section 6, which then displays the bottom value during the next hold period.

For example, the bottom value 520 in a hold period HD11 is sent through the control section 8 to the display section 6 at the end of the hold period HD11 and is displayed on the display section 6 during the next hold period HD12. The bottom value 500 in the hold period HD12 is sent through the control section 8 to the display section 6 at the end of the hold period HD12 and is displayed on the display section 6 during the next hold period HD13.

FIGS. 3(a) to 3(d) are drawings showing display examples of light reception amounts and hold values on the display section 6 of the photoelectric switch in FIG. 1.

Figure 3:
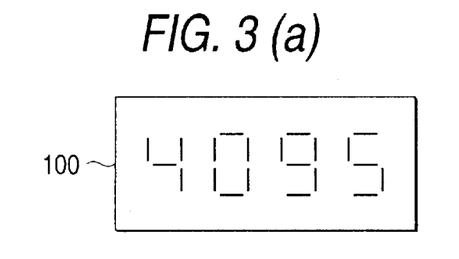
FIGS. 3(a) to 3(d) are drawings showing display examples of light reception amounts or hold values on a display section of the photoelectric switch in FIG. 1.

In the example in FIG. 3(a), a light reception amount or a hold value is displayed in a numeric value on a panel 100 made of LEDs (light emitting diodes) or an LCD (liquid crystal display). In the example in FIG. 3(b), a light reception amount or a hold value is displayed in a bar graph on LEDs 101 arranged like a bar.

In the example in FIG. 3(c), a light reception amount or a hold value is displayed in a fan-shaped graph on a panel 102 made of an LCD. In the example in FIG. 3(d), a light reception amount and a hold value are displayed at two stages on a panel 103 made of LEDs or an LCD.

FIGS. 4(a) to 4(f) are drawings showing display examples in the hold value display mode on the display section 6 of the photoelectric switch in FIG. 1.

Figure 4:
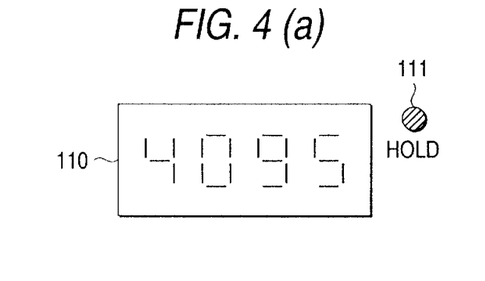
FIGS. 4(a) to 4(f) are drawings showing display examples in a hold value display mode on the display section of the photoelectric switch in FIG. 1.

In the example in FIG. 4(a), the hold value display mode is indicated on an LED 111 that is on, in addition to a numeric display of a hold value on a panel 110. In the example in FIG. 4(b), the hold value display mode is indicated on an LED 113 that is on, in addition to a bar graph display of a hold value on LEDs 112. In the example in FIG. 4(c), the hold value display mode is indicated in a small character string "HOLD" above a numeric display of a hold value on a panel 115 made of an LCD. In the example in FIG. 4(d), the hold value display mode is indicated by a character "HH" to the left of a numeric display of a hold value on a panel 116 made of an LCD or LEDs.

In the example in FIG. 4(e), the hold value display mode is indicated by a character string "HOLD" on a panel 118 made of an LCD or LEDs, in addition to bar graph display of a hold value on LEDs 117.

In the example in FIG. 4(f), "HLd" indicating the hold value display mode and a hold value are displayed on a panel 119 made of an LCD or LEDs in a time division manner. For example, "HLd" indicating the hold value display mode is displayed for 0.25 seconds, then the hold value is displayed for one second, and this display sequence is repeated. "–" to the upper left of "HLd" indicates that the hold value display mode means the peak hold mode. In the bottom hold mode, "–" is displayed to the lower left of "HLd" indicates the hold value display mode.

In place of or in addition to a hold value, a value provided by processing the hold value may be displayed. For example, a margin of the light reception amount relative to the threshold value may be displayed. The margin is expressed by the ratio between the threshold value and the light reception amount (for example, if percentage (%) is adopted, (light reception amount/threshold value×100)) or the difference between the light reception amount and the threshold value (=light reception amount−threshold value).

Figure 5:
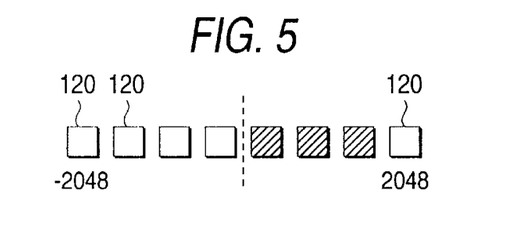
FIG. 5 is a drawing showing a display example of a margin on the display section of the photoelectric switch in FIG. 1.

FIG. 5 is a drawing showing a display example of a margin on the display section 6 of the photoelectric switch in FIG. 1. In the example in FIG. 5, the difference between the light reception amount and the threshold value is displayed in a bar graph on LEDs 120 arranged like a bar. The center of the LEDs 120 arranged like a bar corresponds to 0, the left denotes negative, and the right denotes positive.

The display mode is changed, for example, by operating a switch such as a slide switch, a jog switch, or a pushbutton switch of the operation section 7. For example, change is made between light reception amount display and hold value display each time the pushbutton switch of the operation section 7 is pressed.

For example, while the pushbutton switch is pressed, the hold circuit 4 may perform the hold operation and when the pushbutton switch is released, the hold value may be displayed on the display section 6 for a predetermined amount of time. Further, for example, when the pushbutton switch is pressed, the hold circuit 4 may start the hold operation and when the pushbutton switch is again pressed, the hold value may be displayed on the display section 6 for a predetermined amount of time.

FIGS. 6(a) to 6(d) are drawings showing examples of hold time setting methods on the operation section 7 of the photoelectric switch in FIG. 1.

Figure 6:
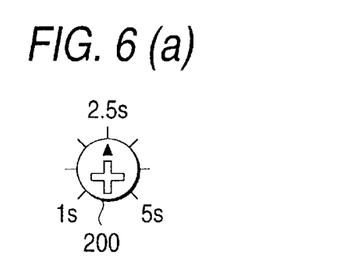
FIGS. 6(a) to 6(d) are drawings showing examples of hold time setting methods on an operation section of the photoelectric switch in FIG. 1.

In the example in FIG. 6(a), any desired hold time is set by turning a trimmer 200. In the example in FIG. 6(b), any desired hold time is set by switching a rotary switch 201. In the example in FIG. 6(c), any desired hold time is set on a menu screen 202 by software. In the example in FIG. 6(d), any desired hold time is set by sliding a slide switch 203. The hold time may be fixed to one second, for example.

The hold period is not set to a given time; instead, the number of times the on-to-off or off-to-on state transition of the detection signal DT has been made may be counted and the period until the count reaches a preset number of times may be set as the hold period.

Figure 7:
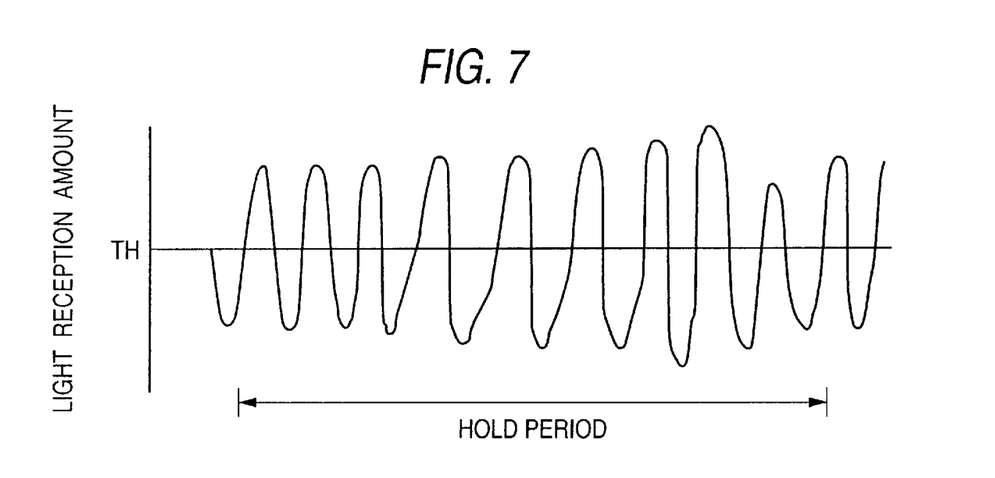
FIG. 7 is a drawing showing a hold period setting method based on the on-to-off or off-to-on state transition of a detection signal.

FIG. 7 is a drawing showing a hold period setting method based on the on-to-off or off-to-on state transition of the detection signal. In the example in FIG. 7, the period until the number of times the on-to-off or off-to-on state transition of the detection signal DT has been made because the light reception amount exceeds a threshold value TH reaches 10 is set as the hold period.

In this case, the hold time control section 5 counts the number of times the off-to-on or on-to-off state transition of the detection signal DT has been made. When the count reaches a predetermined number of times, the hold time control section 5 turns on the hold timing signal HT and resets the count repeatedly.

This hold period setting method makes it possible to set a constant number of samples on which peak value or bottom value calculation is to be made in the hold period if the production line speed is not constant or the objects to be detected on the production line are not equally spaced from each other.

As described above, with the photoelectric switch of this embodiment, the peak value or the bottom value of the light reception amount held for each hold period is displayed on the display section 6. Thus, if the objects to be detected on the production line move at a high speed, whether or not the sensitivity of the switch is adequate can be checked without reducing the production line speed. Therefore, production efficiency is improved.

Particularly, with the photoelectric switch of the penetration type, the held peak value indicates the light reception amount when the object to be detected does not exist in the sense area. Lowering of the light reception amount level caused by a shift in the optical axis, dirt on the light emission or reception face, characteristic degradation of the light emitting element of the light emission section 1, etc., can be recognized by monitoring the peak value. The held bottom value is compared with the threshold value, whereby the margin of the light reception amount relative to the threshold value can be known.

On the other hand, with the photoelectric switch of reflection type, the held bottom value indicates the light reception amount when the object to be detected does not exist in the sense area. During detection in a state in which a background object exists, lowering of the light reception amount level caused by a shift in the optical axis, dirt on the light emission or reception face, characteristic degradation of the light emitting element of the light emission section 1, etc., can be recognized by monitoring the bottom value. The held peak value is compared with the threshold value, whereby the margin of the light reception amount relative to the threshold value can be known.

Figure 8:
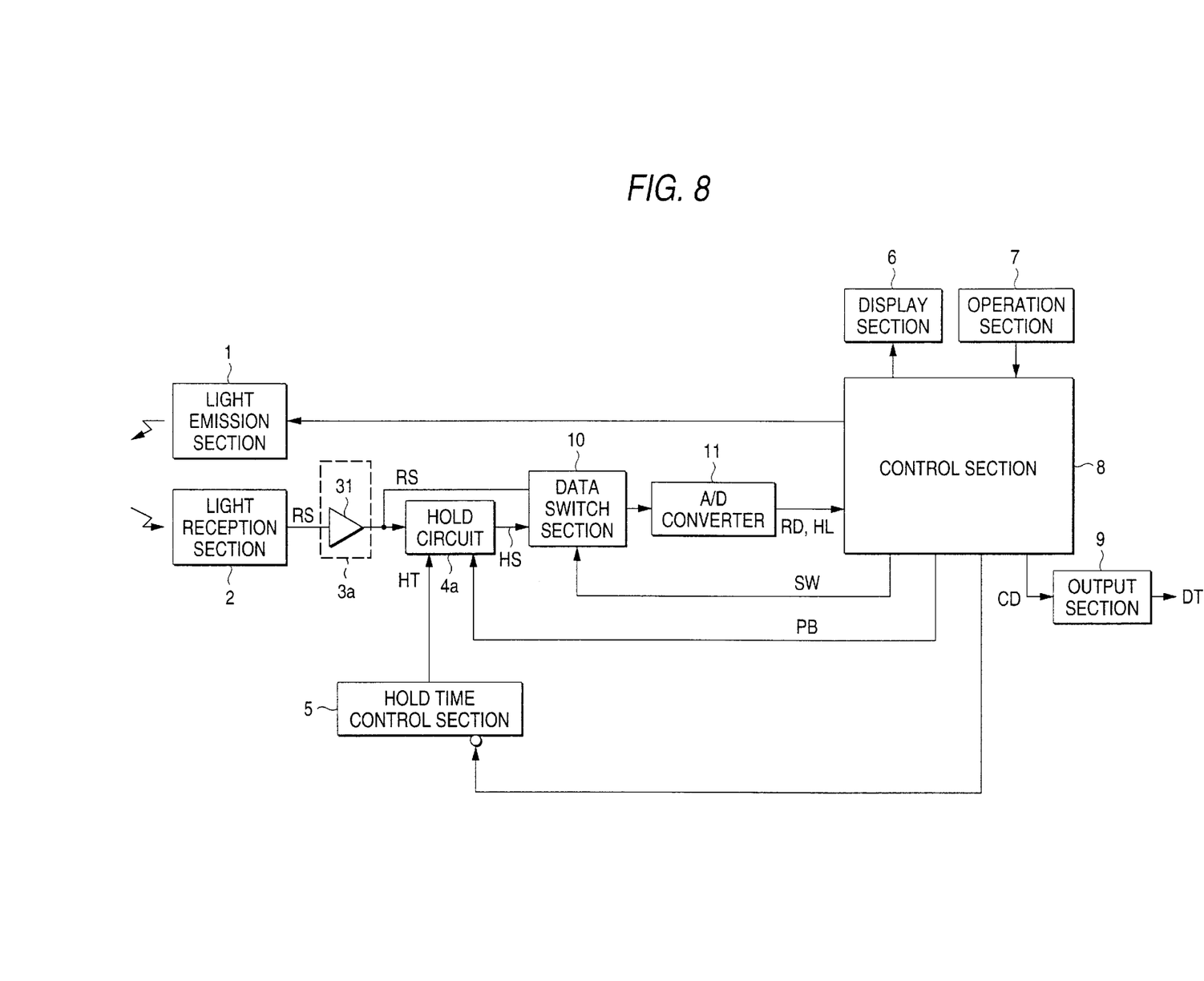
FIG. 8 is a block diagram showing the configuration of a photoelectric switch in a second embodiment of the invention.

FIG. 8 is a block diagram showing the configuration of a photoelectric switch in a second embodiment of the invention.

The photoelectric switch of FIG. 8 differs from that of FIG. 1 in that it is provided with a detection section 3a, a hold circuit 4a, a data switch section 10, and an A/D converter 11 in place of the detection section 3 and the hold circuit 4 of FIG. 1.

The detection section 3a is made of an amplifier 31 for amplifying an analog light reception signal RS output from a light reception section 2. The hold circuit 4a holds the peak value or bottom value of the light reception signal RS amplified by the amplifier 31. It is made of an analog circuit and contains a voltage holding capacitor, for example.

When holding the peak value, the hold circuit 4a compares an input voltage value with a voltage value across the capacitor. If the input voltage value is larger, the hold circuit 4a charges the capacitor until the voltage value across the capacitor becomes equal to the input voltage value; if the voltage value across the capacitor is larger, the hold circuit 4a holds the voltage value intact. When holding the bottom value, the hold circuit 4a compares an input voltage value with a voltage value across the capacitor. If the input voltage value is smaller, the hold circuit 4a discharges the capacitor until the voltage value across the capacitor becomes equal to the input voltage value; if the voltage value across the capacitor is smaller, the hold circuit 4a holds the voltage value intact.

A control section 8 gives a hold mode change signal PB to the hold circuit 4a. If the hold mode change signal PB indicates a peak hold mode, the hold circuit 4a holds the peak value of the light reception signal RS every hold time defined by a hold time control section 5 and outputs the hold value as a hold signal HS. If the hold mode change signal PB indicates a bottom hold mode, the hold circuit 4a holds the bottom value of the light reception signal RS every hold time defined by the hold time control section 5 and outputs the hold value as a hold signal HS.

The control section 8 gives a display mode change signal SW to the data switch section 10. If the display mode change signal SW indicates a light reception amount display mode, the data switch section 10 outputs the light reception signal RS output from the amplifier 31 to the A/D converter 11; if the display mode change signal SW indicates a hold value display mode, the data switch section 10 outputs the hold signal HS output from the hold circuit 4a to the A/D converter 11.

The A/D converter 11 converts the analog light reception signal RS or hold signal HS output from the data switch section 10 into a digital signal, and outputs digital light reception data RD indicating the light reception amount or digital hold data HL indicating the hold value to the control section 8.

Other components of the photoelectric switch of the second embodiment and the operation thereof are similar to those of the photoelectric switch of the first embodiment.

In the second embodiment, a light emission section 1, a light reception section 2, the detection section 3a, the data switch section 10, and the A/D converter 11 make up the detection means. The operation section 7 corresponds to a threshold value setting means. The control section 8 corresponds to a comparison means, and an output section 9 corresponds to a detection signal output means. The light emission section 1 corresponds to a light emission means and the light reception section 2 corresponds to a light reception means. The hold circuit 4a corresponds to a hold means and a display section 6 corresponds to a display means. Further, the hold time control section 5, the operation section 7, and the control section 8 make up the hold period setting means.

Also with the photoelectric switch of the second embodiment, the peak value or the bottom value of the light reception amount held for each hold period is displayed on the display section 6. Thus, if the objects to be detected move at a high speed, whether or not the sensitivity of the switch is adequate can be checked without reducing the production line speed. Therefore, the production efficiency is improved.

Figure 9:
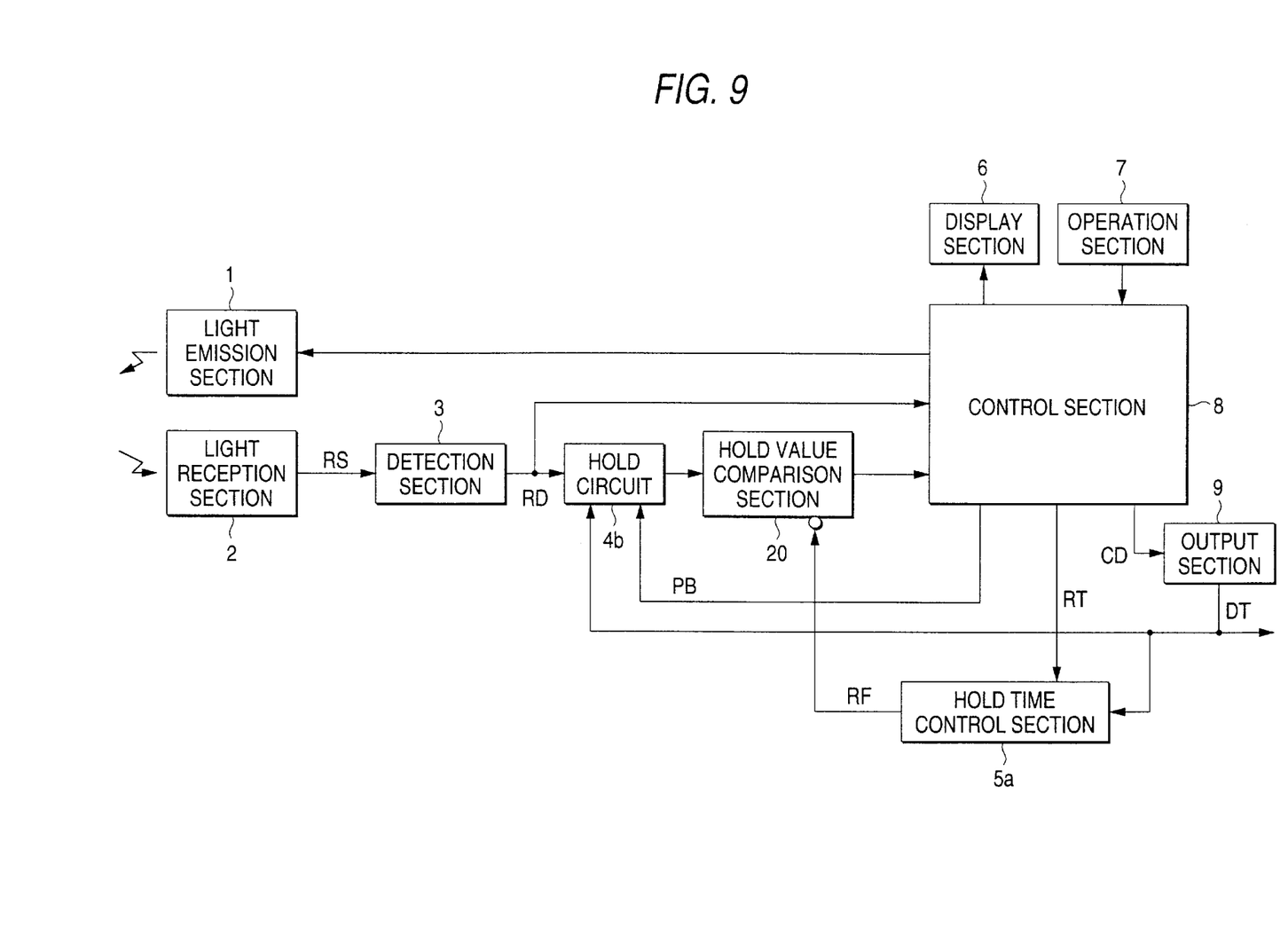
FIG. 9 is a block diagram showing the configuration of a photoelectric switch in a third embodiment of the invention.

FIG. 9 is a block diagram showing the configuration of a photoelectric switch in a third embodiment of the invention.

The photoelectric switch in FIG. 9 differs from that of FIG. 1 in that it is provided with a hold circuit 4b and a hold time control section 5a in place of the hold circuit 4 and the hold time control section 5 of FIG. 1, and further includes a hold value comparison section 20.

A detection signal DT output from an output section 9 is fed into the hold circuit 4b and the hold time control section 5a. The hold circuit 4b responds to the off-to-on state transition of the detection signal DT with outputting the hold value at the point in time to the hold value comparison section 20 and initializing the hold value stored in an internal register.

In the embodiment, the time interval between the detection signal DT making an off-to-on state transition and making the next off-to-on state transition is one cycle.

A control section 8 gives a hold mode change signal PB for making change between a peak hold mode and a bottom hold mode to the hold circuit 4b based on the mode set by operating an operation section 7. If the hold mode change signal PB indicates the peak hold mode, the hold circuit 4b holds the peak value of the light reception amount in each cycle and outputs the hold value at the end of the cycle. If the hold mode change signal PB indicates the bottom hold mode, the hold circuit 4b holds the bottom value of the light reception amount in each cycle and outputs the hold value at the end of the cycle.

In the peak hold mode, the hold value comparison section 20 compares the hold value (namely, the peak value) output in one cycle from the hold circuit 4b with that output in another cycle in sequence to find the minimum value of the peak value, and stores the minimum value in an internal register for comparison. In the bottom hold mode, the hold value comparison section 20 compares the hold value (namely, the bottom value) output in one cycle from the hold circuit 4b with that output in another cycle in sequence to find the maximum value of the bottom value, and stores the maximum value in the internal register for comparison.

The hold time control section 5a counts the number of times the off-to-on state transition of the detection signal DT has been made. When the count reaches a setup number of times, the hold time control section 5a gives a refresh signal RF to the hold value comparison section 20. The hold time control section 5a is reset in response to a reset signal output from the control section 8.

Upon reception of the refresh signal RF from the hold time control section 5a, the hold value comparison section 20 outputs the found minimum value of the peak value or the found maximum value of the bottom value to the control section 8 and initializes the internal register for comparison.

Thus, each time the hold time control section 5a send the refresh signal RF to the hold value comparison section 20, the minimum value of the peak values in more than one cycle or the maximum value of the bottom values in more than one cycle is output to the control section 8.

The control section 8 causes a display section 6 to display the minimum value of the peak value or the maximum value of the bottom value output from the hold value comparison section 20. It can also cause a display section 6 to display the light reception amount indicated on light reception data RD output from a detection section 3 as the display mode is changed by operating the operation section 7.

Thus, with the photoelectric switch of the third embodiment, each time the hold time control section 5a sends the refresh signal RF to the hold value comparison section 20, the minimum value of the peak values in more than one cycle or the maximum value of the bottom values in more than one cycle is displayed on the display section 6.

Therefore, if the objects to be detected move at a high speed, display of the light reception amount can be read and in addition, the worst value of the margin of the sensitivity of the switch can be known. A threshold value is set so as to have a margin with respect to the worst value, whereby the optimum sensitivity of the switch can be set without being affected by variations in the positions and dirt on the surfaces of the objects to be detected.

In this embodiment, a light emission section 1, a light reception section 2, and the detection section 3 make up the detection means. The operation section 7 corresponds to a threshold value setting means. The control section 8 corresponds to a comparison means. The output section 9 corresponds to a detection signal output means. The light emission section 1 corresponds to a light emission means and the light reception section 2 corresponds to a light reception means. The hold circuit 4b corresponds to a hold and output means, the hold value comparison section 20 corresponds to a hold value output means, and the display section 6 corresponds to a display means. Further, the hold time control section 5a and the control section 8 make up a hold period setting means.

In this embodiment, the setup number of times applied to the hold time control section 5a is constant, but the user can also set any number of times in the hold time control section 5a through the control section 8 by operating a slide switch, a trimmer, etc., of the operation section 7.

In this embodiment, the hold circuit 4b and the hold time control section 5a operate in response to the off-to-on state transition of the detection signal DT. However, the hold circuit 4b may output the hold value to the hold value comparison section 20 in response to the on-to-off state transition of the detection signal DT, and the hold time control section 5a may count the number of times the on-to-off state transition of the detection signal DT has been made and output the refresh signal RF to the hold value comparison section 20.

Figure 10:
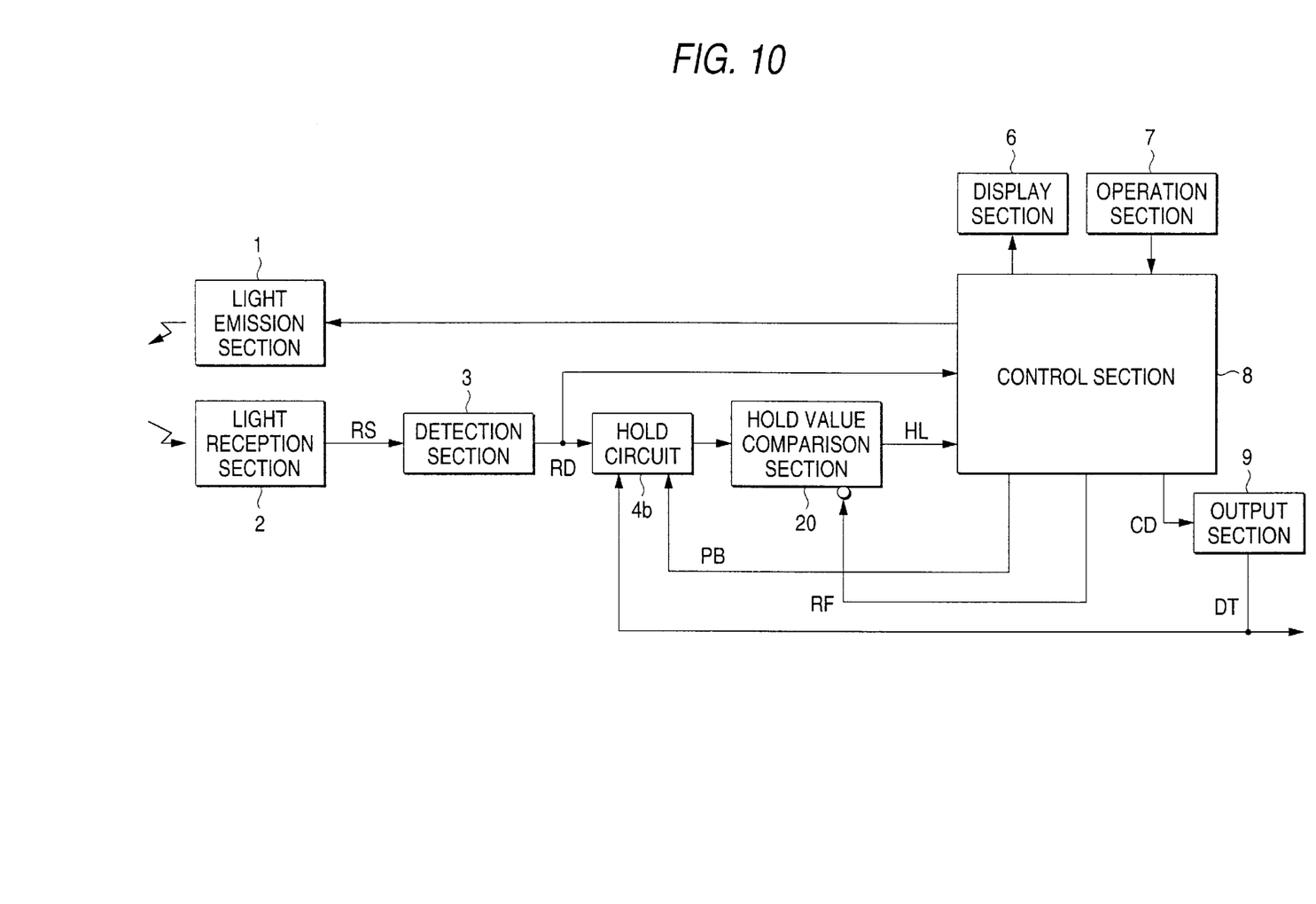
FIG. 10 is a block diagram showing the configuration of a photoelectric switch in a fourth embodiment of the invention.
Figure 11:
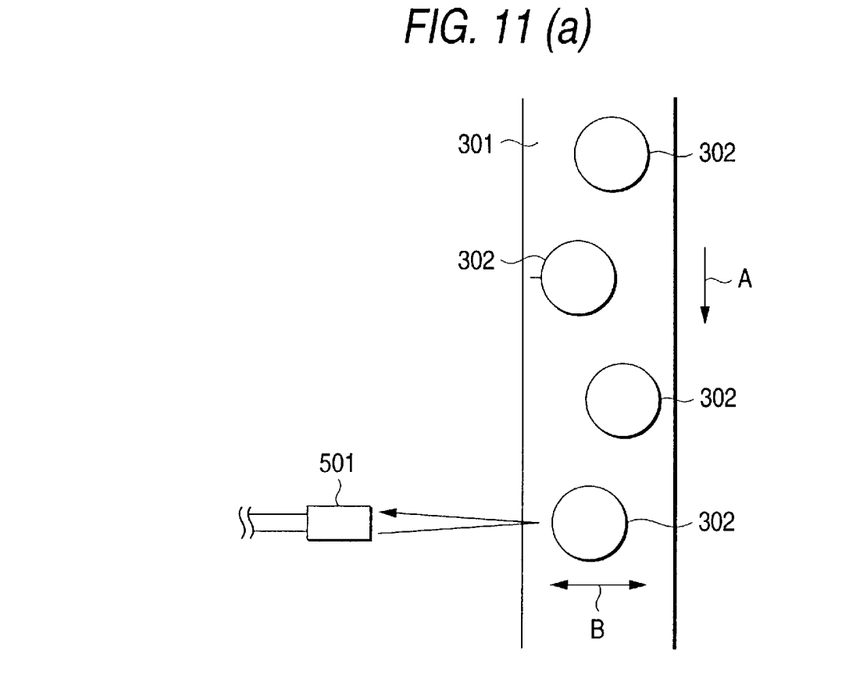
FIGS. 11(a) and 11(b) are drawings describing the advantages of the photoelectric switches of FIGS. 9 and 10 as reflection type.
Figure 12:
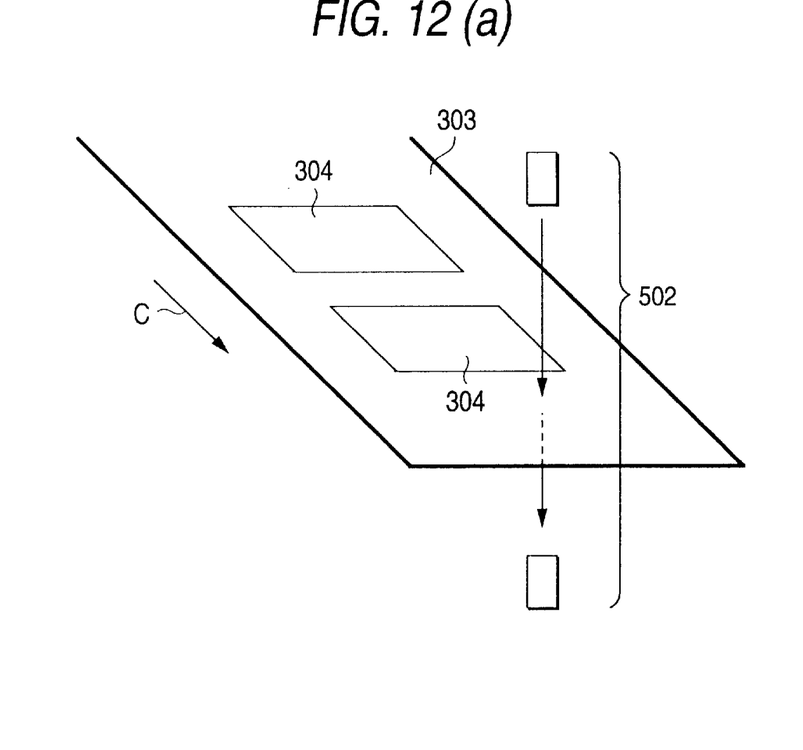
FIGS. 12(a) and 12(b) are drawings describing the advantages of the photoelectric switches in FIGS. 9 and 10 as penetration type.

FIG. 10 is a block diagram showing the configuration of a photoelectric switch in a fourth embodiment of the invention.

The photoelectric switch of FIG. 10 differs from that of FIG. 9 in that it is not provided with the hold time control section 5a.

The user can command a hold value comparison section 20 to be refreshed by operating an operation section 7. A control section 8 outputs a refresh signal RF to the hold value comparison section 20 based on the command entered through the operation section 7.

For example, while the user releases a pushbutton switch of the operation section 7, the control section 8 makes the refresh signal RF active, and while the user presses the pushbutton switch of the operation section 7, the control section 8 makes the refresh signal RF inactive.

In this case, while the user presses the pushbutton switch of the operation section 7, the hold value comparison section 20 finds the minimum value of the peak values or the maximum value of the bottom values output in sequence from a hold circuit 4b. When the user releases the pushbutton switch of the operation section 7, the hold value comparison section 20 outputs the minimum value of the peak values or the maximum value of the bottom values to the control section 8, which then causes a display section 6 to display the minimum value of the peak values or the maximum value of the bottom values.

With the photoelectric switch of the fourth embodiment, the refresh signal RF fed into the hold value comparison section 20 can be controlled by operating the operation section 7, so that advantages similar to those of the photoelectric switch of the third embodiment can be provided by the comparatively simple configuration.

FIGS. 11(a) to 12(b) show the advantages of the photoelectric switches of FIGS. 9 and 10.

In FIG. 11(a), objects to be detected 302 on a production line 301 moving in the direction indicated by the arrow A are shifted in position in the direction indicated by the arrow B. In this case, if a photoelectric switch of reflection type 501 is used to detect the objects to be detected 302, peak values P1, P2, P3, P4, and P5 of the light reception amounts in cycles CY1, CY2, CY3, CY4, and CY5 vary as shown in FIG. 11(b). Such variations in the peak values also occur depending on the state of the surface of each object to be detected 302.

A bottom value B0 is the light reception amount of a background when no objects to be detected 302 are detected.

In this case, a threshold value TH of the photoelectric switch is set so as to have a margin with respect to the minimum value of the peak values P1 to P5, whereby the optimum sensitivity of the switch can be set without being affected by the variations in the objects to be detected 302.

In FIG. 12(a), semitranslucent objects to be detected 304 such as seals on a mount 303 moving in the direction indicated by the arrow C are detected with a photoelectric switch of the penetration type 502. In this case, bottom values B1, B2, B3, B4, and B5 of the light reception amounts in cycles CY11, CY12, CY13, CY14, and CY15 vary, as shown in FIG. 12(b), due to variations in thickness of the objects to be detected 304 and dirt on their surfaces.

A peak value P0 is the light reception amount of light penetrating the mount 303 when no objects to be detected 304 are detected.

In this case, the threshold value TH of the photoelectric switch is set so as to have a margin with respect to the maximum value of the bottom values B1 to B5, whereby the optimum sensitivity of the switch can be set without being affected by the variations in the objects to be detected 304.

In the photoelectric switches in FIGS. 9 and 10, in place of or in addition to the minimum or maximum value, a value provided by processing the minimum or maximum value may be displayed on the display section 6. For example, a margin of the minimum or maximum value relative to the threshold value may be displayed. The margin is expressed by the ratio between the threshold value and the minimum or maximum value or the difference between the minimum or maximum value and the threshold value.

The invention can be applied not only to the photoelectric switches, but also to other switches such as proximity switches and ultrasonic switches.

While only certain embodiments of the invention have been specifically described herein, it will be apparent that numerous modifications may be made thereto without departing from the spirit and scope of the invention.

What is claimed is:

1. A detection switch for detecting the presence or absence of a moving object to be detected at one position, said detection switch comprising:

detection means for outputting a detection amount provided depending on the presence or absence of the object to be detected;

threshold value setting means for setting a threshold value;

comparison means for comparing the detection amount output from said detection means with the threshold value set through said threshold value setting means and outputting the comparison result;

detection signal output means for outputting the presence or absence of the object to be detected as a detection signal based on the comparison result output from said comparison means;

hold means for holding a maximum or minimum value of the detection amounts output from said detection means every predetermined hold period and outputting the maximum or minimum value for each hold period; and display means for displaying the maximum or minimum value output from said hold means.

2. The detection switch of claim 1, further including hold period setting means for setting the hold period to a constant time.

3. The detection switch of claim 1, further including a hold period setting means for setting the hold period based on the number of times a predetermined result has occurred in the detection signal output from said detection signal output means.

4. The detection switch of claim 2, wherein said hold period setting means sets the hold period to any desired time in response to an external operation.

5. The detection switch of claim 1, wherein said display means displays the threshold value set through said threshold value setting means or a ratio or a difference between the threshold value and the maximum or minimum value output from said hold means.

6. A detection switch for detecting the presence or absence of a moving object to be detected at one position, said detection switch comprising:

detection means for outputting a detection amount provided depending on the presence or absence of the object to be detected;

threshold value setting means for setting a threshold value;

comparison means for comparing the detection amount output from said detection means with the threshold value set through said threshold value setting means and outputting the comparison result;

detection signal output means for outputting the presence or absence of the object to be detected as a detection signal based on the comparison result output from said comparison means;

hold and output means for assuming that the time interval between a predetermined result in the detection signal output from said detection signal output means and the next predetermined result is one hold period and holding and outputting a maximum or minimum value of the detection amounts output from said detection means for each hold period;

hold value output means for outputting a minimum value of maximum values output from said hold and output means within a predetermined number of the hold periods or a maximum value of minimum values output from said hold and output means within a predetermined number of the hold periods; and display means for displaying the minimum or maximum value output from said hold value output means.

7. The detection switch of claim 6, further including hold period setting means for setting the predetermined number of the hold periods to a constant value.

8. The detection switch of claim 7, wherein said hold period setting means sets the predetermined number of the hold periods to any desired value in response to an external operation.

9. The detection switch of claim 6, wherein said display means displays the threshold value set through said threshold value setting means or a ratio or a difference between the threshold value and the minimum or maximum value output from said hold value output means.

10. A photoelectric switch for detecting the presence or absence of a moving object to be detected at a detection position, said photoelectric switch comprising:

light emission means for emitting light to the detection position;

light reception means for receiving penetrating light or reflected light from the detection position;

detection means for outputting a light reception amount of said light reception means;

threshold value setting means for setting a threshold value;

comparison means for comparing the light reception amount output from said detection means with the threshold value set through said threshold value setting means and outputting a comparison result;

detection signal output means for outputting the presence or absence of the object to be detected as a detection signal based on the comparison result output from said comparison means;

hold means for holding a maximum or minimum value of the light reception amounts output from said detection means every predetermined hold period and outputting the maximum or minimum value for each hold period; and display means for displaying the maximum or minimum value output from said hold means.

11. A photoelectric switch for detecting the presence or absence of a moving object to be detected at a detection position, said photoelectric switch comprising:

light emission means for emitting light to the detection position;

light reception means for receiving penetrating light or reflected light from the detection position;

detection means for outputting a light reception amount of said light reception means;

threshold value setting means for setting a threshold value;

comparison means for comparing the light reception amount output from said detection means with the threshold value set through said threshold value setting means and outputting a comparison result;

detection signal output means for outputting the presence or absence of the object to be detected as a detection signal based on the comparison result output from said comparison means;

hold and output means for assuming that the time interval between a predetermined result in the detection signal output from said detection signal output means and the next predetermined result is one hold period and holding and outputting the maximum or minimum value of the light reception amounts output from said detection means for each hold period;

hold value output means for outputting a minimum value of maximum values output from said hold and output means within a predetermined number of the hold periods or a maximum value of minimum values output from said hold and output means within a predetermined number of the hold periods; and display means for displaying the minimum or maximum value output from said hold value output means.

* * * * *